United States Patent
Chen et al.

(10) Patent No.: US 9,143,143 B2
(45) Date of Patent: Sep. 22, 2015

(54) VCO RESTART UP CIRCUIT AND METHOD THEREOF

(71) Applicant: United Microelectronics Corp., Hsinchu (TW)

(72) Inventors: Po-Hua Chen, Changhua County (TW); Yu-Yee Liow, Hsinchu County (TW); Wen-Hong Hsu, Hsinchu (TW); Hsueh-Chen Cheng, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 40 days.

(21) Appl. No.: 14/153,919

(22) Filed: Jan. 13, 2014

(65) Prior Publication Data

US 2015/0200626 A1 Jul. 16, 2015

(51) Int. Cl.
*H03L 7/00* (2006.01)
*H03L 7/183* (2006.01)
*H03L 7/095* (2006.01)
*H03L 7/093* (2006.01)

(52) U.S. Cl.
CPC ............ *H03L 7/183* (2013.01); *H03L 7/093* (2013.01); *H03L 7/095* (2013.01)

(58) Field of Classification Search
CPC .......... H03L 7/095; H03L 7/093; H03L 7/183
USPC ........... 331/1 A, 16, 17, 18, 34; 327/156, 147
See application file for complete search history.

(56) References Cited

U.S. PATENT DOCUMENTS

| | | |
|---|---|---|
| 3,663,828 A | 5/1972 | Low et al. |
| 3,818,402 A | 6/1974 | Golaski et al. |
| 4,163,944 A | 8/1979 | Chambers et al. |
| 4,245,355 A | 1/1981 | Pascoe et al. |
| 4,409,608 A | 10/1983 | Yoder |
| 4,816,784 A | 3/1989 | Rabjohn |
| 4,931,748 A * | 6/1990 | McDermott et al. .......... 331/1 A |
| 5,159,205 A | 10/1992 | Gorecki et al. |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi et al. |
| 5,583,359 A | 12/1996 | Ng et al. |
| 5,637,900 A | 6/1997 | Ker et al. |
| 5,760,456 A | 6/1998 | Grzegorek et al. |
| 5,808,330 A | 9/1998 | Rostoker et al. |
| 5,923,225 A | 7/1999 | De Los Santos |
| 5,959,820 A | 9/1999 | Ker et al. |
| 6,008,102 A | 12/1999 | Alford et al. |
| 6,081,146 A | 6/2000 | Shiochi et al. |
| 6,172,378 B1 | 1/2001 | Hull et al. |
| 6,194,739 B1 | 2/2001 | Ivanov et al. |
| 6,246,271 B1 | 6/2001 | Takada et al. |

(Continued)

*Primary Examiner* — Arnold Kinkead
(74) *Attorney, Agent, or Firm* — J.C. Patents

(57) ABSTRACT

A circuit and a method for restarting up a VCO of a PLL are introduced herein. The VCO restart up circuit receives a power down signal, an external signal, a clock output from the VCO and generates a trigger signal to the VCO to trigger the VCO clock to leave a stable mode. In other words, if the VCO clock is in the stable mode, the VCO restart up circuit generates one or more than one pulse on a trigger signal to restart up the VCO. Oppositely, if the VCO is not in the stable mode, there is no pulse on the trigger signal generated by the VCO restart up circuit and the VCO needs not to be restarted up.

19 Claims, 6 Drawing Sheets

(56) References Cited

U.S. PATENT DOCUMENTS

| | | |
|---|---|---|
| 6,285,578 B1 | 9/2001 | Huang |
| 6,291,872 B1 | 9/2001 | Wang et al. |
| 6,370,372 B1 | 4/2002 | Molnar et al. |
| 6,407,412 B1 | 6/2002 | Iniewski et al. |
| 6,427,226 B1 | 7/2002 | Mallick et al. |
| 6,448,858 B1 | 9/2002 | Helms et al. |
| 6,452,442 B1 | 9/2002 | Laude |
| 6,456,221 B2 | 9/2002 | Low et al. |
| 6,461,914 B1 | 10/2002 | Roberts et al. |
| 6,480,137 B2 | 11/2002 | Kulkarni et al. |
| 6,483,188 B1 | 11/2002 | Yue et al. |
| 6,486,765 B1 | 11/2002 | Katayanagi |
| 6,509,805 B2 | 1/2003 | Ochiai |
| 6,518,165 B1 | 2/2003 | Yoon et al. |
| 6,521,939 B1 | 2/2003 | Yeo et al. |
| 6,545,547 B2 | 4/2003 | Fridi et al. |
| 6,560,306 B1 | 5/2003 | Duffy et al. |
| 6,588,002 B1 | 7/2003 | Lampaert et al. |
| 6,593,838 B2 | 7/2003 | Yue |
| 6,603,360 B2 | 8/2003 | Kim et al. |
| 6,608,363 B1 | 8/2003 | Fazelpour |
| 6,611,223 B2 | 8/2003 | Low et al. |
| 6,625,077 B2 | 9/2003 | Chen |
| 6,630,897 B2 | 10/2003 | Low et al. |
| 6,639,298 B2 | 10/2003 | Chaudhry et al. |
| 6,653,868 B2 | 11/2003 | Oodaira et al. |
| 6,668,358 B2 | 12/2003 | Friend et al. |
| 6,700,771 B2 | 3/2004 | Bhattacharyya |
| 6,720,608 B2 | 4/2004 | Lee |
| 6,724,677 B1 | 4/2004 | Su et al. |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar et al. |
| 6,822,282 B2 | 11/2004 | Randazzo et al. |
| 6,822,312 B2 | 11/2004 | Sowlati et al. |
| 6,833,756 B2 | 12/2004 | Ranganathan |
| 6,841,847 B2 | 1/2005 | Sia et al. |
| 6,847,572 B2 | 1/2005 | Lee et al. |
| 6,853,272 B1 | 2/2005 | Hughes |
| 6,876,056 B2 | 4/2005 | Tilmans et al. |
| 6,885,534 B2 | 4/2005 | Ker et al. |
| 6,901,126 B1 | 5/2005 | Gu |
| 6,905,889 B2 | 6/2005 | Lowther |
| 6,909,149 B2 | 6/2005 | Russ et al. |
| 6,927,664 B2 | 8/2005 | Nakatani et al. |
| 6,958,522 B2 | 10/2005 | Clevenger et al. |
| 7,009,252 B2 | 3/2006 | Lin et al. |
| 7,027,276 B2 | 4/2006 | Chen |
| 7,205,612 B2 | 4/2007 | Cai et al. |
| 7,262,069 B2 | 8/2007 | Chung et al. |
| 7,365,627 B2 | 4/2008 | Yen et al. |
| 7,368,761 B1 | 5/2008 | Lai et al. |
| 7,405,642 B1 | 7/2008 | Hsu et al. |
| 7,656,206 B2 * | 2/2010 | Omote ........................ 327/156 |
| 7,672,100 B2 | 3/2010 | Van Camp |
| 8,354,866 B2 | 1/2013 | Jain et al. |
| 2002/0019123 A1 | 2/2002 | Ma et al. |
| 2002/0036545 A1 | 3/2002 | Fridi et al. |
| 2002/0188920 A1 | 12/2002 | Lampaert et al. |
| 2003/0076636 A1 | 4/2003 | Ker et al. |
| 2003/0127691 A1 | 7/2003 | Yue et al. |
| 2003/0183403 A1 | 10/2003 | Kluge et al. |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean et al. |
| 2006/0108694 A1 | 5/2006 | Hung et al. |
| 2006/0267102 A1 | 11/2006 | Cheng et al. |
| 2007/0102745 A1 | 5/2007 | Hsu et al. |
| 2007/0210416 A1 | 9/2007 | Hsu et al. |
| 2007/0234554 A1 | 10/2007 | Hung et al. |
| 2007/0246801 A1 | 10/2007 | Hung et al. |
| 2007/0249294 A1 | 10/2007 | Wu et al. |
| 2007/0296055 A1 | 12/2007 | Yen et al. |
| 2008/0094166 A1 | 4/2008 | Hsu et al. |
| 2008/0185679 A1 | 8/2008 | Hsu et al. |
| 2008/0189662 A1 | 8/2008 | Nandy et al. |
| 2008/0200132 A1 | 8/2008 | Hsu et al. |
| 2008/0299738 A1 | 12/2008 | Hsu et al. |
| 2008/0303623 A1 | 12/2008 | Hsu et al. |
| 2009/0029324 A1 | 1/2009 | Clark |
| 2009/0201625 A1 | 8/2009 | Liao et al. |
| 2010/0279484 A1 | 11/2010 | Wang et al. |

\* cited by examiner

VCO RESTART UP CIRCUIT AND METHOD THEREOF

BACKGROUND OF THE INVENTION

1. Field of the Invention

The present invention generally relates to a restart up circuit, in particular, to a restart up circuit for a VCO (voltage-controlled oscillator) of a PLL (phase-locked loop), and a method to restart up the VCO of the PLL.

2. Description of Related Art

In order to avoid the VCO of the PLL being in a stable mode, the operation of the PLL typical needs a power down signal to start up the VCO initially.

However, if the VCO starts up fail and is still in a stable mode, the power down signal needs to be sent to the PLL again and forces the VCO to restart up manually. Using the power down signal to restart up the VCO may influence the PLL loop stability.

SUMMARY OF THE INVENTION

Accordingly, the present invention is directed to create a VCO restart up circuit for triggering an output of the VCO to leave a stable mode.

In accordance with one of exemplary embodiments of the invention, a VCO restart up circuit is introduced herein. The VCO restart up circuit comprises a detection circuit, a logic circuit, and a one shot generator. The detection circuit generates a detection signal by receiving an output signal of a VCO, a power down signal and an external signal. The logic circuit generates a restart up signal by logic operation on the detection signal and a reference signal. The frequency of the reference signal is lower than or equal to a frequency of the external signal. The one shot generator generates a trigger signal according to the restart up signal. The reference signal may be used to increase the pulse numbers of the trigger signal, and the trigger signal is provided to the VCO for triggering the output signal of the VCO to leave a stable mode.

In accordance with one of exemplary embodiments of the invention, a VCO restart up circuit is introduced herein. The VCO restart up circuit comprises a detection circuit, a divider, a logic circuit, and a one shot generator. The detection circuit generates a detection signal by receiving an output signal of the VCO, a power down signal and an external signal. The divider generates a reference signal by dividing the external signal. The logic circuit generates a restart up signal by logic operation on the detection signal and the reference signal. The one shot generator generates a trigger signal according to the restart up signal. In one embodiment, the reference signal may be used to increase the pulse numbers of the trigger signal and the trigger signal is provided to the VCO for triggering the output signal of the VCO to leave a stable mode.

In accordance with one of exemplary embodiments of the invention, a detection circuit for at least one of the aforesaid VCO restart up circuits is introduced herein. The detection circuit an energy storing element, a first switch and a bi-stable trigger. A first end of the energy storing element is coupled to a ground voltage source and a second end of the energy storing element is coupled to a node. The first switch is controlled by a power down signal. A first end of the first switch is coupled to a power source and a second end of the first switch is coupled to the node. The energy storing element is charged by the power source and the voltage level at the node is equal to the voltage level in response to the power down signal. An input terminal of the bi-stable trigger is coupled to the node. The bi-stable trigger generates the detection signal in response to the voltage level at the node.

In one of exemplary embodiments, the detection circuit further comprises a one-shot generator, a resistor, a first current source and a second switch. The one-shot generator receives the output signal of the VCO and generates a one-shot signal accordingly. A first end of the resistor is connected to the power source and a second end of the resistor is coupled to the node. A second end of the first current source is coupled to a ground voltage source. A second switch is controlled by the one-shot signal of the one-shot generator. A first end of the second switch is coupled to the node, and a second end of the second switch is coupled to a first end of the first current source.

In one of exemplary embodiments, the detection circuit further comprises a first one-shot generator, a second one-shot generator, a first current source, a second current source, a second switch, a third switch and a resistor. The first one-shot generator receives the output signal of the VCO and generates a first one-shot signal accordingly. A first end of the first current source is coupled to a second end of the second switch, and a second end of the first current source is coupled to a ground voltage source. The second switch is controlled by the first one-shot signal of the first one-shot generator. A first end of the second switch is coupled to the node. A second one-shot generator receives the external signal and generates a second one-shot signal accordingly. A first end of the second current source is coupled to a power source. The third switch is controlled by the second one-shot signal of the second one-shot generator. A first end of the third switch is coupled to a second end of the second current source, and a second end of the third switch is coupled to the node.

In one of exemplary embodiments, the detection circuit further comprises a divider, a first one-shot generator, a second one-shot generator, a first current source, a second current source, a second switch, a third switch and a resistor. The divider receives the output signal of the VCO and generates a divided clock by dividing the output signal of the VCO by M, where M is an integer. A first one-shot generator receives the divided clock of the divider and generates a first one-shot signal accordingly. A second end is coupled to a ground voltage source and the first current source provides a current corresponding to M. The second switch is controlled by the first one-shot signal of the first one-shot generator. A first end of the second switch is coupled to the node, and a second end of the second switch is coupled to a first end of the first current source. A second one-shot generator receives the external signal and generating a second one-shot signal accordingly. A first end of the second current source is coupled to a power source. The third switch is controlled by the second one-shot signal of the second one-shot generator. A first end of the third switch is coupled to a second end of the second current source, and a second end of the third switch is coupled to the node.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
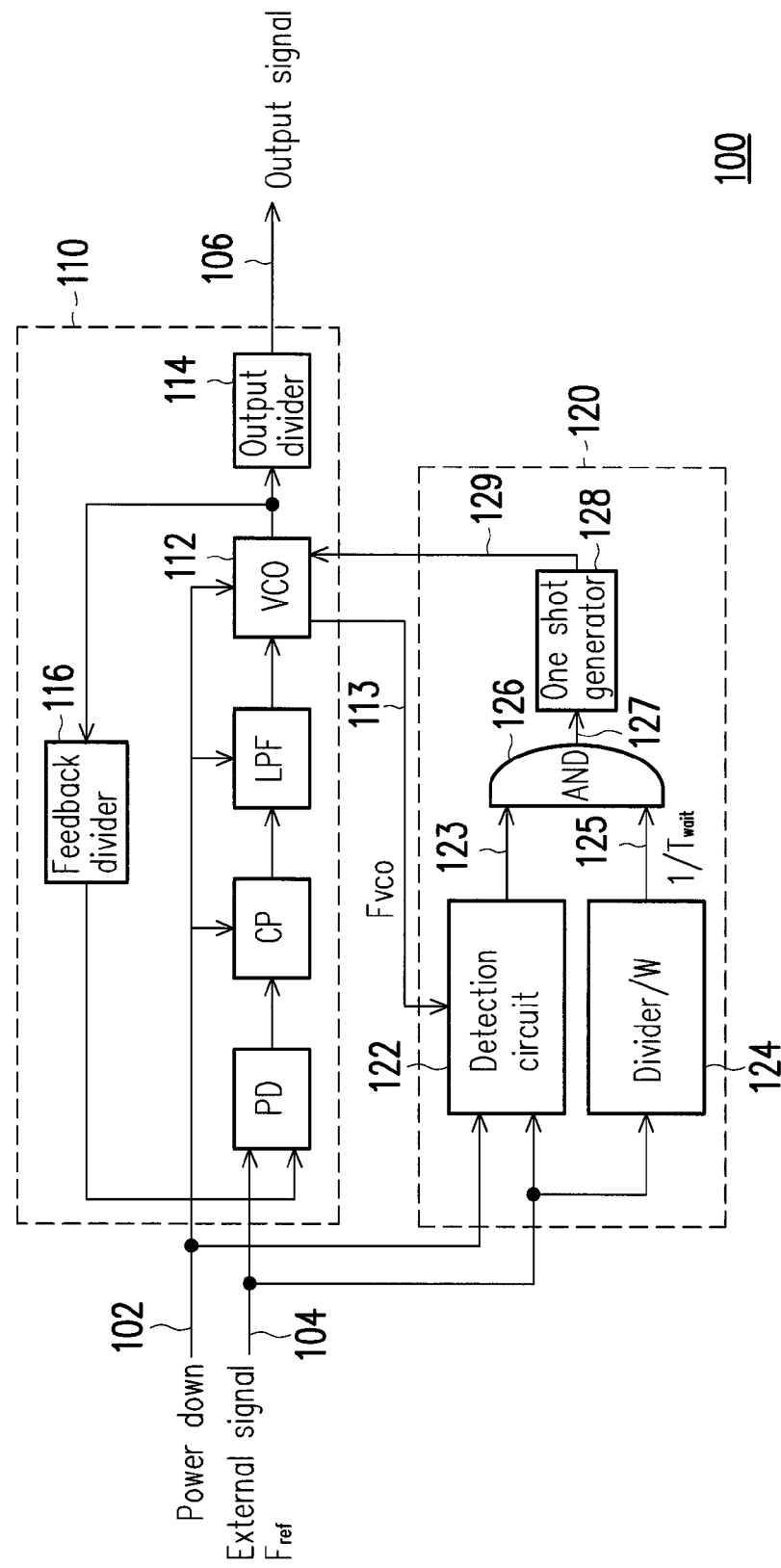
FIG. 1A is a schematic diagram illustrating a VCO restart up circuit used with a PLL, in accordance with an exemplary embodiment of the invention.

Reference will now be made in detail to the present embodiments of the invention, examples of which are illustrated in the accompanying drawings. Wherever possible, the same reference numbers are used in the drawings and the description to refer to the same or like parts.

An exemplary embodiment of the present general inventive concept, i.e., a VCO restart up circuit for triggering an output of the VCO to leave a stable mode, may be used in many devices or circuits. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

In accordance with an exemplary embodiment of the inventive, a VCO restart up circuit comprises a detection circuit, a divider, an AND gate and a one shot generator. The VCO restart up circuit receives a power down signal, an external signal, and an output from a VCO and generates a trigger signal to trigger the output of the VCO to leave a stable mode. In other words, if the VCO is in the stable mode, the VCO restart up circuit generates one or more pulses on the trigger signal to restart up the VCO. If the VCO is not in the stable mode, there is no pulse on the trigger signal generated by the VCO restart up circuit and the VCO needs not to be restarted up.

In accordance with another exemplary embodiment of the inventive concept, a VCO restart up circuit comprises a detection circuit, an AND gate and a one shot generator. The VCO restart up circuit generates a trigger signal to the VCO to trigger a VCO to leave a stable mode by receiving a power down signal, an external signal, a reference signal, and an output from the VCO. The frequency of the reference signal is equal to or is lower than the frequency of the external signal. In other words, if the VCO is in the stable mode, the VCO restart up circuit generates one pulse or more than one pulse on the trigger signal to restart up the VCO. In other case, if the VCO is not in a stable mode, there is no pulse on the trigger signal generated by the VCO restart up circuit to restart up the VCO.

Certain embodiments will be described with reference to following drawings containing features of different implementations. The illustrated implementations, however, may vary in various applications due to design choices and other factors. Accordingly, the implementations are not to be viewed as limiting the inventive concept to idealized forms.

FIG. 1A is a schematic diagram illustrating a VCO restart up circuit used with a PLL, in accordance with an exemplary embodiment of the inventive concept.

Referring to FIG. 1A, the PLL 110 is a phase-lock loop circuit. The PLL 110 includes a PD (phase detector), a CP (charge pump), a LPF (low pass filter), a VCO 112 (voltage controlled oscillator), an output divider 114, and a feedback divider 116. The PLL 110 generates an output clock signal 106 by receiving a power down signal 102 and an external signal (with a frequency "Fref", as shown) 104. If the VCO 112 fails to start up and stays operating in a stable mode, there is no clock output from the PLL 110. To check the status of the VCO 112, the signal (with a frequency "Fvco", as shown) 113 output from the VCO 112 is input to the VCO restart up circuit 120. The VCO restart up circuit 120 detects that if the VCO 112 is operating in the stable mode or not, and then generates a trigger signal 129 to restart up the VCO 112.

In one embodiment, the VCO restart up circuit 120 receives the power down signal 102, the external signal 104 and the signal 113 output from the VCO 112 of the PLL 110 and generates a trigger signal 129 to the VCO 112 to trigger the VCO 112 to leave a stable mode. In other words, if the VCO 112 is operating in the stable mode (the frequency of the signal 113 is almost equal to 0 Hz), the VCO restart up circuit 120 generates one or more than one pulse on the trigger signal 129 to restart up the VCO 112. In other case, if the VCO 112 is not in the stable mode and behaves as an oscillator (the frequency of the signal 113 is larger than 0 Hz), there is no pulse on the trigger signal 129 generated by the VCO restart up circuit 120 to restart up the VCO 112.

In one embodiment, the VCO restart up circuit 120 may include a detection circuit 122, a divider 124, an AND gate 126 and a one shot generator 128.

The detection circuit 122 is used to detect the status of the signal 113. The detection circuit 122 receives the power down signal 102, the external signal 104 and the signal 113, and then generates a detection signal 123 accordingly. The detection signal 123 output from the detection circuit 122 may be in a status of logic high to indicate that the VCO 112 is in the stable mode, otherwise, the detection signal 123 may be in a status of logic low to indicate that the VCO 112 is not operating in the stable mode.

The divider 124 generates a reference signal 125 by dividing the external signal 104 by W, where W is an integer. The frequency of the reference signal 125 may be equal to or lower than the frequency (Fref) of the external signal 104.

The logic gate 126 performs a logical operation on the detection signal 123 and the reference signal 125 and then generates a restart up signal 127, which is transmitted to the one shot generator 128. For example, in the embodiment, an AND logic gate is used.

The one shot generator 128 generates the trigger signal 129 according to the restart up signal 127. In one embodiment, the one shot generator 128 may be any kind of pulse generators, which may generate pulses on the trigger signal 129 according to the rising or falling edge of the restart up signal 127. However, the inventive concept is not limited thereto.

When the detection signal 123 is in the logic high (the VCO 112 is in the stable mode), the restart up signal 127 output form the logic gate 126 may be substantially equal to the reference signal 125 after the logical operation of the logic gate 126, and the trigger signal 129 may be generated according the rising or falling edge of the reference signal 125. Therefore, the period of the trigger signal 129 to trigger the VCO 112 to leave the stable mode is related to the frequency of the reference signal 124. In other case, if the detection signal 123 is low (the VCO 112 is not in the stable mode), the restart up signal 127 is in the logic low after the logical operation of the logic gate 126 and no pulse is generated on the trigger signal 129 to restart up the VCO 112.

Figure 1B:
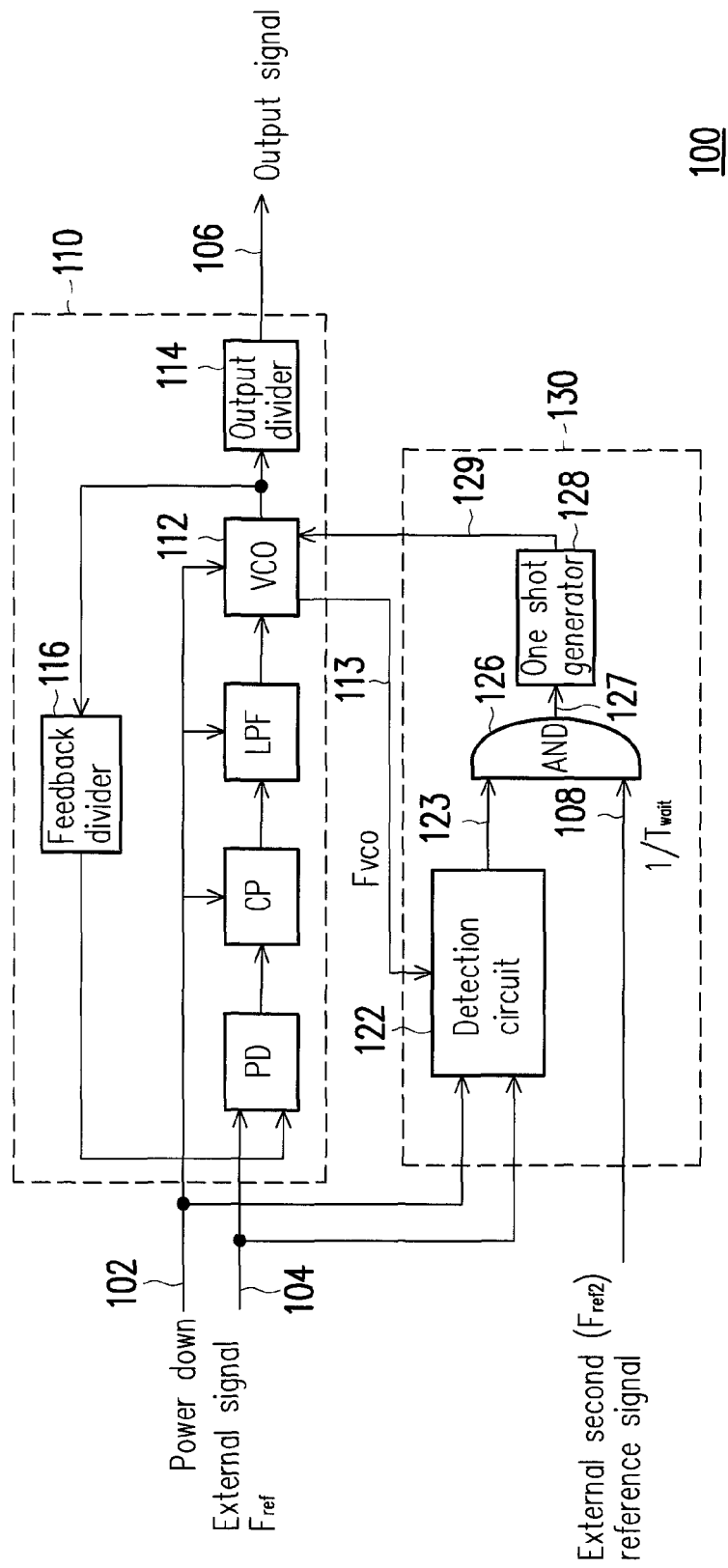
FIG. 1B is a schematic diagram illustrating another VCO restart up circuit used with a PLL, in accordance with an exemplary embodiment of the invention.

FIG. 1B is a schematic diagram illustrating another VCO restart up circuit used with a PLL 110, in accordance with one of exemplary embodiments of the inventive concept. Wherever possible, the same reference numbers are used in the drawings and the description to refer to the same or like parts.

Referring to FIG. 1B, the VCO restart up circuit 130 receives a power down signal 102, an external signal (with a frequency "Fref", as shown) 104, an external sec-end reference signal (with a frequency "Fref2", as shown) 108, and a signal (with a frequency "Fvco", as shown) 113 output from the VCO 112 of the PLL 110 and then generates a trigger signal 129 to the VCO 112 to trigger the VCO 112 to leave a stable mode. The frequency of the external reference signal Fref2 is equal to or is lower than the frequency of the external signal Fref. In other words, if the VCO 112 is operating in the stable mode (the frequency of the signal 113, Fvco, is almost equal to 0 Hz), the VCO restart up circuit 130 generates one or more than one pulses on the trigger signal 129 to restart up the VCO 112. If the VCO 112 is not in the stable mode and behaves as an oscillator (the frequency of the signal 113 is larger than 0 Hz), there is no pulse generated on the trigger signal 129 by the VCO restart up circuit 130 to restart up the VCO 112.

The VCO restart up circuit 130 may include a detection circuit 122, an AND gate 126 and a one shot generator 128.

The detection circuit 122 is used to detect the status of the signal 113. The detection circuit 122 receives the power down signal 102, the external signal 104, and the signal 113, and then generates a detection signal 123 accordingly. The detection signal 123 output from the detection circuit 122 is in a status of logic high, for example, to indicate that the VCO 112 is operating in the stable mode, otherwise, the detection signal 123 is in a status of logic low, for example, to indicate that the VCO 112 is not operating in the stable mode.

The logic gate 126, for example, an AND logic gate, performs a logical operation on the detection signal 123 and the external reference signal 108 and then generates a restart up signal 127 to the one shot generator 128.

The one shot generator 128 generates a trigger signal 129 according to the restart up signal 127. The one shot generator 128 may be, for example, a pulse generator to generate pulses on the trigger signal 129 according to the rising or falling edge of the restart up signal 127.

When the detection signal 123 is in the status of logic high (the VCO 112 is operating in the stable mode), the restart up signal 127 output from the logic gate 126 may substantially equal to the external reference signal 108 after the logical operation of the logic gate 126, and the trigger signal 129 may be generated according the rising or falling edge of the external reference signal 108. Therefore, the period of the trigger signal 129 to trigger the VCO 112 to leave the stable mode is related to the frequency of the external reference signal 108. In some cases, if the detection signal 123 is in the status of logic low (the VCO 112 is not operating in the stable mode), the restart up signal 127 is in the status of logic low after the logical operation of the logic gate 126 and no pulse is generated on the trigger signal 129 to restart up the VCO 112.

Figure 2:
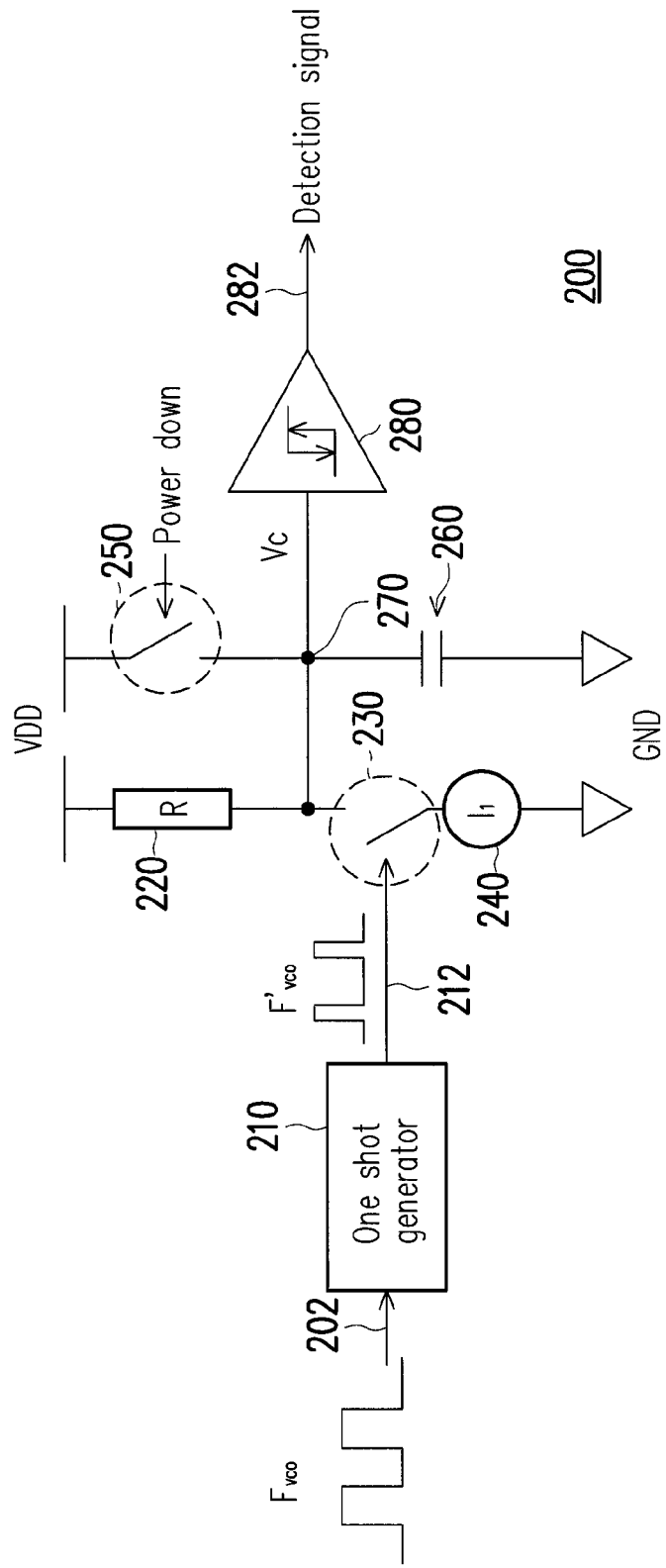
FIG. 2 is a circuit schematically illustrating a Detection circuit, in accordance with an exemplary embodiment of the invention.

FIG. 2 is a circuit illustrating a detection circuit 200, in accordance with an exemplary embodiment of the inventive concept.

Referring to FIG. 2, the detection circuit 200 includes a one shot generator 210, a resistor 220, a first switch 230, a first current source 240, a second switch 250, an energy storing element e 260 and a bi-stable trigger 280. In one embodiment, the energy storing element may be a capacitor.

The one-shot generator 210 receives the signal 202 and generates a one-shot signal 212 with a frequency "F'vco" accordingly. A first end of the resistor 220 is connected to a power source VDD and a second end of the resistor 220 is coupled to a VC node 270. A second end of the first current source 240 is coupled to a ground voltage source GND. A control input end of the first switch 230 is controlled by the one-shot signal 212 output from the one shot generator 210. A first end of the first switch 230 is coupled to the VC node 270, and a second end of the first switch 230 is coupled to the first end of the first current source 240. A control end of the second switch 250 is controlled by the power down signal A. A first end of the second switch 250 is coupled to the power source VDD. A control end of the second switch 250 is controlled by the power down signal and a second end of the second switch 250 is coupled to the VC node 270. A first end of the capacitor 260 is coupled to the VC node 270 and a second end of the capacitor 260 is coupled to the ground voltage source GND. An input end of the bi-stable trigger 280 is coupled to the VC node 270. A detection signal 282 generated by the bi-stable trigger 280 is the output signal of the detection circuit 200.

After power-on, a power down signal is provided (such as a high level signal) to turn on the second switch 250. The voltage value on the VC node 270 may be approaching to the voltage value of the power source VDD by charging the capacitor 260 through the second switch 250 and the resistor 220, the detection signal 282 output from the bi-stable trigger 280 may be high. After the power down signal is released (such as a low level signal), if the VCO fails to start up, i.e., the VCO 112 is operating in the stable mode, the frequency Fvco of the signal 202 may be almost 0 Hz and the one-shot signal 212 is in a logic low so that the first switch 230 is still off. The voltage value on the VC node 270 is remained in the value VDD and the detection signal 282 is in the status of logic high to indicate that the VCO, for example, the VCO 112 of FIG. 1A or FIG. 1B, needs to be restarted up to leave the stable mode.

If the VCO is not in the stable mode and it behaves as an oscillator, the frequency of the signal 202 may be larger than 0 Hz and the one-shot signal 212 is generated. The first switch 230 is turned on in response to the one-shot signal 212, during the high level of the one-shot signal 212, and the voltage value on the VC node 270 may be discharged through a path of the first switch 230 and the first current source 240 to the ground voltage source GND. The voltage value on the VC node 270 is approaching to the voltage value of the ground voltage source GND while the one-shot signal 212 is fast and the total discharge current on the first current source 240 is more than the charge current on the resistor 220. Therefore, the detection signal 282 is in the status of logic low to indicate that the signal 202 is not in the stable mode. The bi-stable trigger 280 may be used to immunize the noise on the VC node 270.

Figure 3:
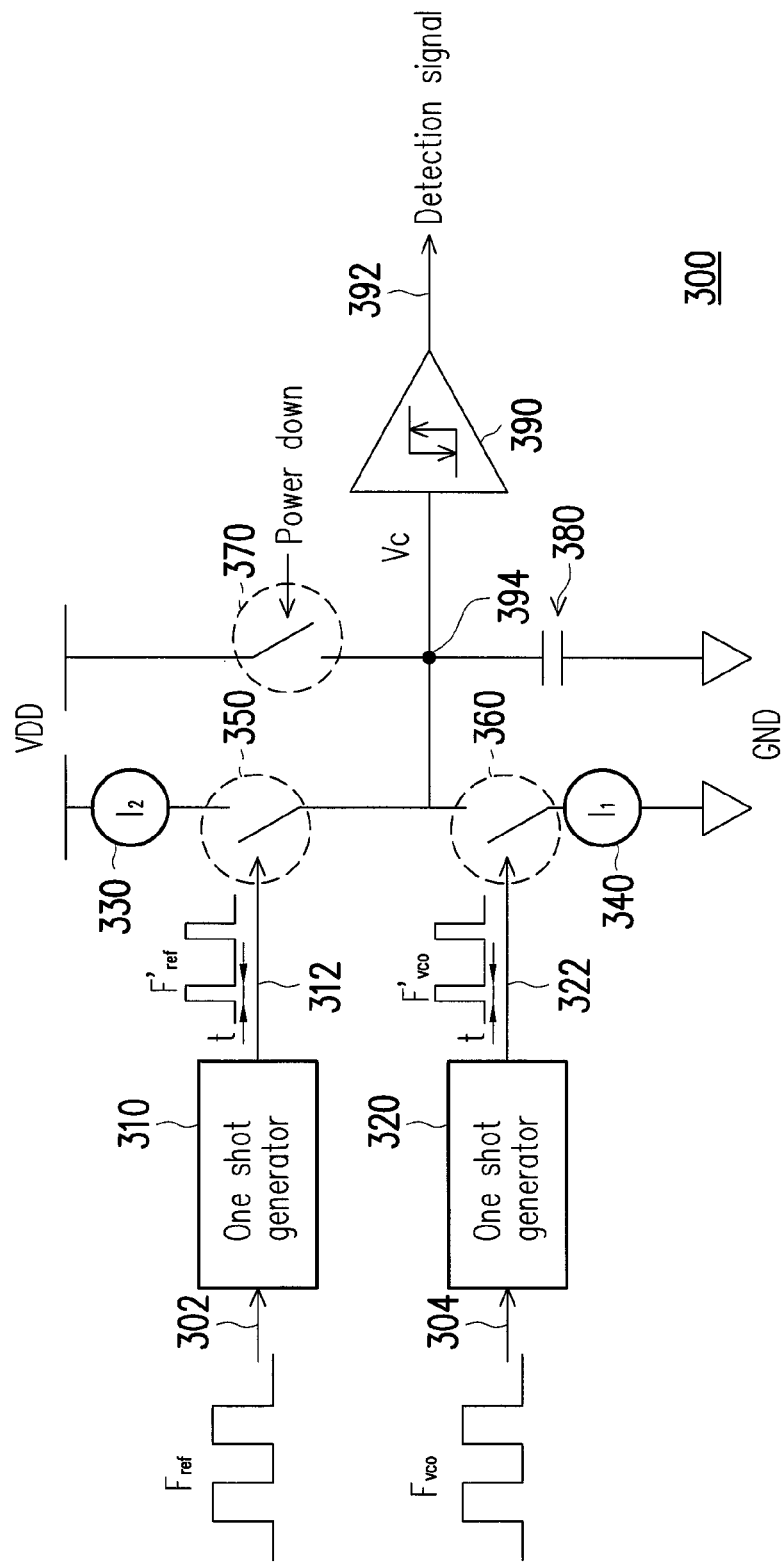
FIG. 3 is another circuit schematically illustrating a Detection circuit, in accordance with an exemplary embodiment of the invention.

FIG. 3 is a circuit illustrating another detection circuit 300, in accordance with an exemplary embodiment of the inventive concept.

Referring to FIG. 3, the detection circuit 300 includes a one-shot generator 310, a one-shot generator 320, a current source 330, a current source 340, a charge switch 350, a discharge switch 360, a switch 370, a capacitor 380 and a bi-stable trigger 390.

The one-shot generator 320 receives the signal 304 and generates a one-shot signal 322 accordingly. The one-shot generator 310 receives an external signal 302 and generates a one-shot signal 312 with a frequency "F'ref", as shown, accordingly. A first end of the current source 330 is connected to a power source VDD. A second end of the current source 340 is coupled to a ground voltage source GND. A control input end of the charge switch 350 is controlled by the one-shot signal 312 output from the one-shot generator 310. A first end of the charge switch 350 is coupled to a second end of the current source 330, and a second end of the charge switch 350 is coupled to a VC node 394. A control input end of the discharge switch 360 is controlled by the one-shot signal 322 output from the one-shot generator 320. A first end of the discharge switch 360 is coupled to a VC node 394, and a second end of the charge switch 360 is coupled to a first end of the current source 340. A control end of the switch 370 is controlled by the power down signal. A first end of the switch 370 is coupled to the power source VDD, and a second end of the switch 370 is coupled to the VC node 394. A first end of the capacitor 380 is coupled to the VC node 394 and a second end of the capacitor 380 is coupled to the ground voltage source GND. An input end of the bi-stable trigger 390 is coupled to the VC node 394, the detection signal 392 generated by the bi-stable trigger 390 is the output signal of the detection circuit 300.

After power-on, the power down signal is provided (such as a high level signal) to turn on the switch 370, the discharge switch 360 and the charge switch 350 are both turned off because the signal 304 is indicated as the VCO is operating in a stable mode. The voltage value on the VC node 394 may be approaching to the voltage value of the power source VDD by charging the capacitor 380 through the switch 370, and the detection signal 392 output from the bi-stable trigger 390 is in a status of logic high. After the power down signal is released (such as a low level signal), the switch 370 is turned off and the external signal 302 is starting to oscillate. Therefore, the one-shot signal 312 is generated and the charge switch 350 is turned on during the high level of the one-shot signal 312.

If the VCO fails to start up, i.e., the VCO is operating in a stable mode, the frequency of the signal 304 may be 0 Hz, and the one-shot signal 322 is in the status of logic low, therefore, the discharge switch 360 is still off. Because the charge switch 350 is on and the discharge switch 360 is off, the voltage value on the VC node 394 is approaching to the voltage value of the power source VDD by charging the capacitor 380 through the charge switch 350 and the detection signal 392 is high to indicate that the VCO needs to be restarted up.

If the VCO is not operating in the stable mode and it behaves as an oscillator, the frequency of the signal 304 is larger than 0 Hz and the one-shot signal 322 is generated. The discharge switch 360 is turned on during the high level of the one-shot signal 322, and the voltage value on the VC node 394 is discharged through a path of the discharge switch 360 and the current source 340. The voltage value on the VC node is approaching to the ground while the signal 304 is one order larger than the external signal 302 and the discharge current I1 of the current source 340 is equal to the charge current I2 of the current source 330. As a result, the detection signal 392 is low and it is no need to generate the restart up signal for the VCO 112. The bi-stable trigger 390 is used to immunize the noise on the VC node.

Referring to FIG. 2 and FIG. 3, the difference between the detection circuit 200 and the detection circuit 300 is that the resistor 220 of FIG. 2 is replaced by the one-shot generator 310, the current source 330 and the charge switch 350 of FIG. 3.

In some case that if the frequency of the signal output from the VCO is very high and if the signal from the VCO is applied to the one-shot generator directly, the one-shot generator may operate at the very high frequency domain. In some case that this kind of operation may has some abnormal problem in a rising and falling time of the one-shot generator. Therefore, a modification of the detection circuit may be further proposed hereafter.

Figure 4:
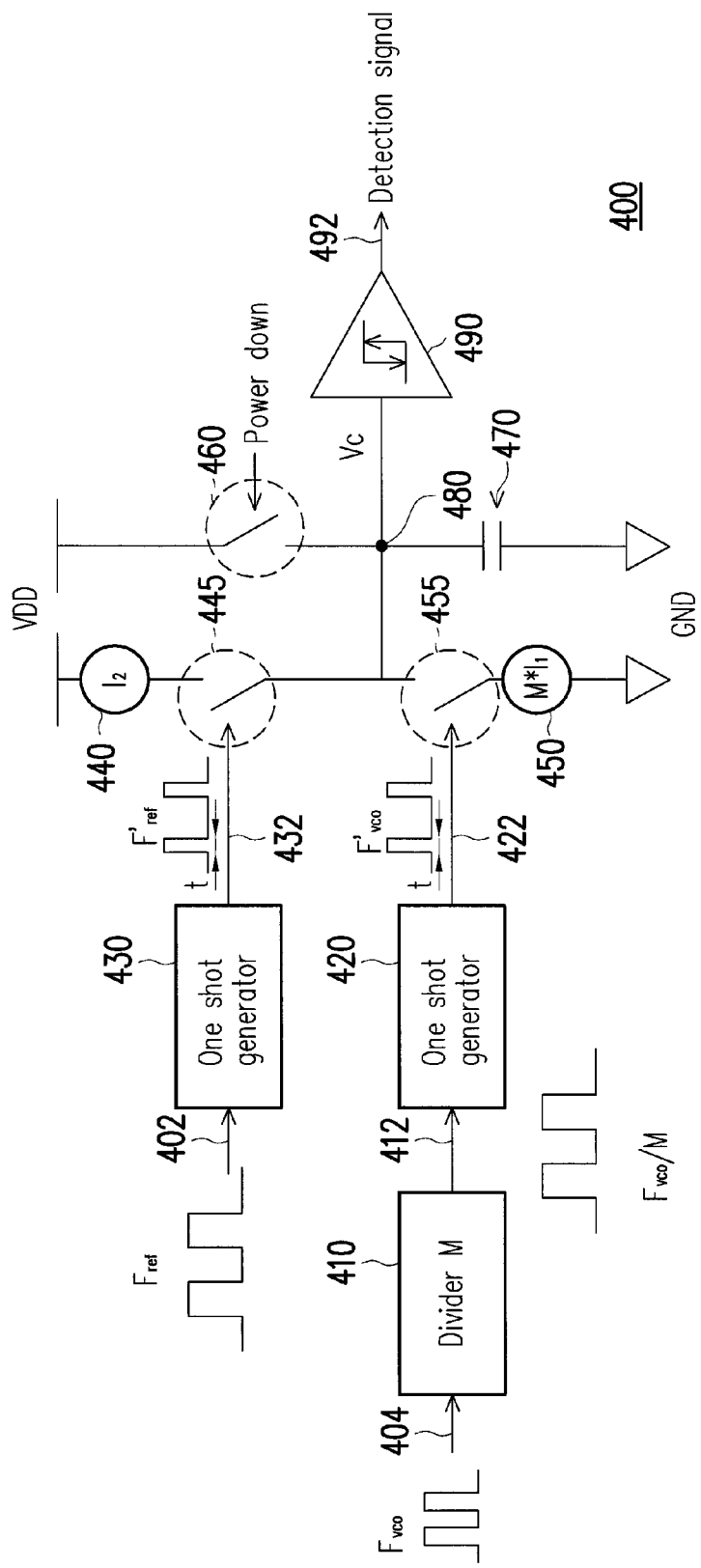
FIG. 4 is a circuit schematically illustrating a Detection circuit modified from the detection circuit of FIG. 3, in accordance with an exemplary embodiment of the invention.

FIG. 4 is a circuit illustrating a detection circuit in accordance with another exemplary embodiment of the inventive concept. The detection circuit 400 is similar with the detection circuit 300, as shown in FIG. 3, the same reference numbers used in the FIG. 3 and the description to refer to the same or like parts.

Referring to FIG. 4, the detection circuit 400 includes a divider 410, a one-shot generator 430, a one-shot generator 420, a current source 440 ("$I_2$", as shown in drawing), a current source 450 ("$M*I_1$", as shown in drawing), a charge switch 445, a discharge switch 455, a switch 460, a capacitor 480 and a bi-stable trigger 490.

The divider 410 generates a divided signal 412 by dividing the signal 404 by M, where M is an integer. The one-shot generator 420 receives the divided signal 412 and generates a one-shot signal 422 in response to the divided signal 412 accordingly. The one-shot generator 430 receives an external signal 402 and generates a one-shot signal 432 in response to the external signal 402. A first end of the current source 440 is connected to a power source VDD. A second end of the current source 450 is coupled to a ground voltage source GND. The charge switch 445 is controlled by the one-shot signal 432 output from the one-shot generator 430. A first end of the charge switch 445 is coupled to a second end of the current source 440, and a second end of the charge switch 445 is coupled to a VC node 480. The discharge switch 455 is controlled by the one-shot signal 422 output from the one-shot generator 420. A first end of the discharge switch 455 is coupled to the VC node 480, and a second end of the charge switch 455 is coupled to the first end of the current source 450. A first end of the switch 460 is coupled to the power source VDD and a second end of the switch 460 is coupled to the VC node 480. The switch 460 is controlled by the power down signal. A first end of the capacitor 470 is coupled to the VC node 480 and a second end of the capacitor 470 is coupled to the ground voltage source GND. An input end of the bi-stable trigger 490 is coupled to the VC node 480, and the detection signal 492 generated by the bi-stable trigger 490 is an output signal 492 of the detection circuit 400.

In order to avoid the one shot generator 420 to be operated in a very high frequency domain, a divider 410 is used to generate a divided signal 412 by dividing the signal 404 by M, where M is an integer, and the one-shot generator 420 generates a one-shot signal 422 by receiving the divided signal 412 instead of the signal 404 directly to control the discharge switch 455. On the other hand, to keep the original discharge capability, the discharge current on the current source 450 is multiplied by M.

Figure 5:
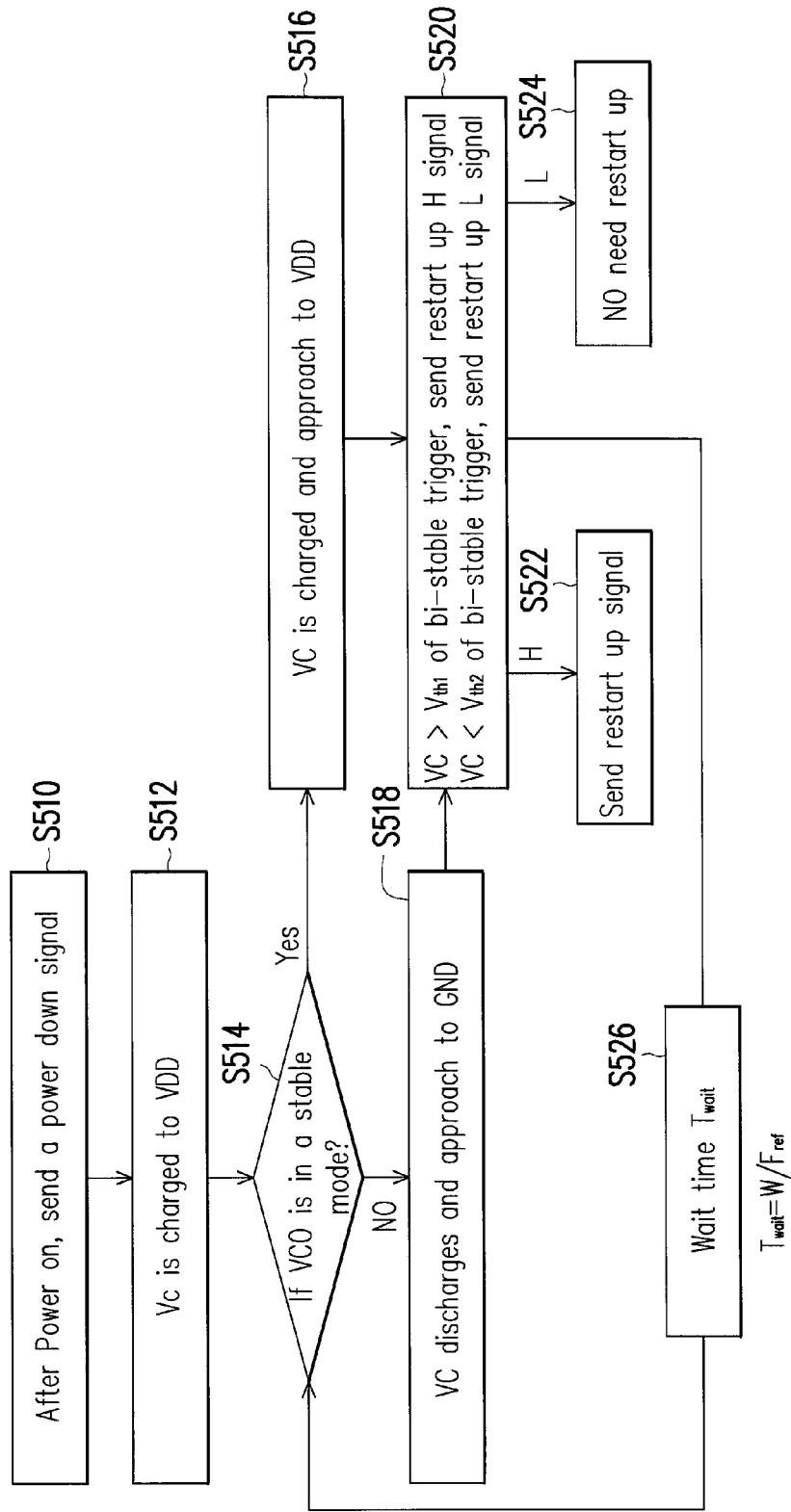
FIG. 5 is a flowchart schematically illustrating operation flow for restarting up a VCO, in accordance with an exemplary embodiment of the invention.

FIG. 5 is a flowchart illustrating an operation flow for restarting up a VCO, in accordance with an exemplary embodiment of the inventive concept.

Referring to FIG. 5, a power down signal (such as a high level signal) is provided after power is on (S510). A voltage value VC on an input end of a bi-stable trigger, such as a Schmitt trigger, is charged to a power voltage level VDD (S512). It is determined that the VCO is operating in a stable mode or not (S514), if the VCO is operating in a stable mode (YES), the voltage value VC on the input end of the bi-stable trigger is charged and approaching to the power voltage level VDD (S516); and if the VCO is not in a stable mode (NO), the voltage value VC on the input end of the bi-stable trigger is discharged and approaching to the ground voltage level GND (S518). If the voltage value VC is higher than a threshold voltage Vth1 of the bi-stable trigger, a restart up signal is in a status of logic high, and if the voltage value VC is lower than another threshold voltage Vth2 of the bi-stable trigger, the restart up signal is low (S520). If the restart up signal is in the status of logic high, a restart up signal is sent to restart up the VCO (S522). If the restart up signal is low, the VCO needs not to be restarted up (S524) and waiting a period of time W/Fref (S526), then performing again the step of checking that the VCO is in a stable mode or not (S514) and the steps after the same (S516, S518, S520, S522, S524 and S526).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit, for restarting up a voltage-controlled oscillator (VCO), the circuit comprising:
    a detection circuit, generating a detection signal by receiving an output signal from the VCO, a power down signal and an external signal;
    a divider, generating a reference signal by dividing the external signal;
    a logic circuit, generating a restart up signal by logic operation on the detection signal and the reference signal; and
    a pulse generator, generating a trigger signal according to the restart up signal, wherein the trigger signal is provided to the VCO for triggering the VCO to leave a stable mode.

2. The circuit of claim 1, wherein the logic circuit is a circuit of a AND function.

3. The circuit of claim 1, wherein the frequency of the reference signal is lower than or equal to the frequency of the output signal from the VCO.

4. The circuit of claim 1, wherein the detection circuit comprising:
    an energy storing element, wherein a first end of the energy storing element is coupled to a ground voltage source and a second end of the energy storing element is coupled to a node;
    a first switch, controlled by the power down signal, wherein a first end of the first switch is coupled to a power source and a second end of the first switch is coupled to the node, wherein the energy storing element is charged by the power source and the voltage level at the node is equal to the voltage level in response to the power down signal; and
    a bi-stable trigger, wherein an input terminal of the bi-stable trigger is coupled to the node, the bi-stable trigger generating the detection signal in response to the voltage level at the node.

5. The circuit of claim 4, wherein the energy storing element is a capacitor.

6. The circuit of claim 4, wherein the detection circuit further comprising:
    a one-shot generator, receiving the output signal of the VCO and generating a one-shot signal accordingly;
    a resistor, wherein a first end of the resistor is connected to the power source and a second end of the resistor is coupled to the node;
    a first current source, wherein a second end of the first current source is coupled to a ground voltage source; and
    a second switch, controlled by the one-shot signal of the one-shot generator, wherein a first end of the second switch is coupled to the node, and a second end of the second switch is coupled to a first end of the first current source.

7. The circuit of claim 4, wherein the detection circuit further comprising:
    a first one-shot generator, receiving the output signal of the VCO and generating a first one-shot signal accordingly;
    a first current source, a second end of the first current source is coupled to a ground voltage source;
    a second switch, controlled by the first one-shot signal of the first one-shot generator, wherein a first end of the second switch is coupled to the node, and a second end of the second switch is coupled to a first end of the first current source;
    a second one-shot generator, receiving the external signal and generating a second one-shot signal accordingly;
    a second current source, a first end of the second current source is coupled to a power source; and
    a third switch, controlled by the second one-shot signal of the second one-shot generator, wherein a first end of the third switch is coupled to a second end of the second current source, and a second end of the third switch is coupled to the node.

8. The circuit of claim 4, wherein the detection circuit further comprising:
    a divider, receiving the output signal of the VCO and generating a divided clock by dividing the output signal of the VCO by M, where M is an integer;
    a first one-shot generator, receiving the divided clock of the divider and generating a first one-shot signal accordingly;
    a first current source, wherein a second end of the first current source is coupled to a ground voltage source, and the first current source provides a current corresponding to M;
    a second switch, controlled by the first one-shot signal of the first one-shot generator, wherein a first end of the second switch is coupled to the node, and a second end of the second switch is coupled to a first end of the first current source;
    a second one-shot generator, receiving the external signal and generating a second one-shot signal accordingly;
    a second current source, a first end of the second current source is coupled to a power source; and
    a third switch, controlled by the second one-shot signal of the second one-shot generator, wherein a first end of the third switch is coupled to a second end of the second current source, and a second end of the third switch is coupled to the node.

9. A circuit, for restarting up a voltage-controlled oscillator (VCO), the circuit comprising:
    a detection circuit, generating a detection signal by receiving an output signal of the VCO, a power down signal and an external signal;
    a logic circuit, generating a restart up signal by logic operation on the detection signal and a reference signal, wherein a frequency of the reference signal is lower than or equal to a frequency of the external signal; and
    a one shot generator, generating a trigger signal according to the restart up signal, wherein the trigger signal is provided to the VCO for triggering the output signal of the VCO to leave a stable mode.

10. The circuit of claim 9, wherein the logic circuit is a circuit of a AND function.

11. The circuit of claim 9, wherein the detection circuit comprising:

an energy storing element, wherein a first end of the energy storing element is coupled to a ground voltage source and a second end of the energy storing element is coupled to a node;
a first switch, controlled by the power down signal, wherein a first end of the first switch is coupled to a power source and a second end of the first switch is coupled to the node, wherein the energy storing element is charged by the power source and the voltage level at the node is equal to the voltage level in response to the power down signal; and
a bi-stable trigger, wherein an input terminal of the bi-stable trigger is coupled to the node, the bi-stable trigger generating the detection signal in response to the voltage level at the node.

12. The circuit of claim 11, wherein the energy storing element is a capacitor.

13. The circuit of claim 11, wherein the detection circuit further comprising:
a one-shot generator, receiving the output signal of the VCO and generating a one-shot signal accordingly;
a resistor, wherein a first end of the resistor is connected to the power source and a second end of the resistor is coupled to the node;
a first current source, wherein a second end of the first current source is coupled to a ground voltage source; and
a second switch, controlled by the one-shot signal of the one-shot generator, wherein a first end of the second switch is coupled to the node, and a second end of the second switch is coupled to a first end of the first current source.

14. The circuit of claim 11, wherein the detection circuit further comprising:
a first one-shot generator, receiving the output signal of the VCO and generating a first one-shot signal accordingly;
a first current source, a second end of the first current source is coupled to a ground voltage source;
a second switch, controlled by the first one-shot signal of the first one-shot generator, wherein a first end of the second switch is coupled to the node, and a second end of the second switch is coupled to a first end of the first current source;
a second one-shot generator, receiving the external signal and generating a second one-shot signal accordingly;
a second current source, a first end of the second current source is coupled to a power source; and
a third switch, controlled by the second one-shot signal of the second one-shot generator, wherein a first end of the third switch is coupled to a second end of the second current source, and a second end of the third switch is coupled to the node.

15. The circuit of claim 11, wherein the detection circuit further comprising:
a divider, receiving the output signal of the VCO and generating a divided clock by dividing the output signal of the VCO by M, where M is an integer;
a first one-shot generator, receiving the divided clock of the divider and generating a first one-shot signal accordingly;
a first current source, a second end is coupled to a ground voltage source, the first current source provides a current corresponding to M;
a second switch, controlled by the first one-shot signal of the first one-shot generator, wherein a first end of the second switch is coupled to the node, and a second end of the second switch is coupled to a first end of the first current source;
a second one-shot generator, receiving the external signal and generating a second one-shot signal accordingly;
a second current source, a first end of the second current source is coupled to a power source; and
a third switch, controlled by the second one-shot signal of the second one-shot generator, wherein a first end of the third switch is coupled to a second end of the second current source, and a second end of the third switch is coupled to the node.

16. A method for restarting up a voltage-controlled oscillator (VCO), comprising:
generating a detection signal by receiving an output signal of a VCO, a power down signal and an external signal;
generating a reference signal by dividing the external signal;
performing a logic operation on the detection signal and the reference signal to generate a restart up signal; and
generating a trigger signal according to the restart up signal to trigger the output signal of the VCO to leave a stable mode.

17. The method for restarting up a VCO according to claim 16, wherein the detection signal is generated by
charging an input end of a bi-stable trigger to a power voltage level while receiving a power down signal after power on;
checking that an operation status of the VCO is in the stable mode or not,
if the operation status of the VCO is in the stable mode, the voltage on the input end of the bi-stable trigger is maintained at the power voltage level, and
if VCO is not in the stable mode, the voltage on the input end of the bi-stable trigger is discharged and approaching to the ground voltage level, wherein
if the voltage level on the input end of the bi-stable trigger is higher than a first threshold voltage of the bi-stable trigger, the detection signal is in a first logic status, and
if the voltage level on the input end of the bi-stable trigger is lower than a second threshold voltage of the bi-stable trigger, the detection signal is in a second logic status, wherein the first threshold voltage is higher than the second threshold voltage.

18. A method for restarting up a VCO, comprising:
generating a detection signal by receiving an output signal from a VCO, a power down signal and an external signal;
performing a logic operation on the detection signal and a reference signal from external to generate a restart up signal, wherein a frequency of the reference signal is lower than or equal to a frequency of the external signal; and
generating a trigger signal according to the restart up signal to trigger the output signal of the VCO to leave a stable mode.

19. The method for restarting up a VCO according to claim 18, wherein the detection signal is generated by
charging an input end of a bi-stable trigger to a power voltage level while receiving a power down signal after power on;
checking that an operation status of the VCO is in the stable mode or not,
if the operation status of the VCO is in the stable mode, the voltage on the input end of the bi-stable trigger is maintained at the power voltage level, and
if VCO is not in the stable mode, the voltage on the input end of the bi-stable trigger is discharged and approaching to the ground voltage level, wherein if the voltage level on the input end of the bi-stable trigger is higher than a first threshold voltage of the bi-stable trigger, the detection signal is in a first logic status, and if the voltage level on the input end of the bi-stable trigger is lower than a second threshold voltage of the bi-stable trigger, the detection signal is in a second logic status, wherein the first threshold voltage is higher than the second threshold voltage.

\* \* \* \* \*